(12) United States Patent
Corzine

(10) Patent No.: US 10,389,104 B1
(45) Date of Patent: Aug. 20, 2019

(54) CIRCUIT BREAKER FOR DC CIRCUITS USING COUPLED INDUCTION

(71) Applicant: Clemson University, Clemson, SC (US)

(72) Inventor: Keith A. Corzine, Clemson, SC (US)

(73) Assignee: CLEMSON UNIVERSITY, Clemson, SC (US)

(*) Notice: Subject to any disclaimer, the term of this patent is extended or adjusted under 35 U.S.C. 154(b) by 181 days.

(21) Appl. No.: 14/988,838

(22) Filed: Jan. 6, 2016

Related U.S. Application Data

(60) Provisional application No. 62/101,423, filed on Jan. 9, 2015.

(51) Int. Cl.
*H02H 3/16* (2006.01)
*H03K 17/687* (2006.01)

(52) U.S. Cl.
CPC ............ *H02H 3/16* (2013.01); *H03K 17/687* (2013.01)

(58) Field of Classification Search
CPC ...... H02H 3/16; H02H 1/0023; H02H 1/0015; H03K 17/687; H01H 9/542; H01H 9/541; H01H 33/596; H01H 9/56; H01H 33/006; H01H 33/593; H01H 9/563
See application file for complete search history.

(56) References Cited

U.S. PATENT DOCUMENTS

| | | | | |
|---|---|---|---|---|
| 4,805,062 A * | 2/1989 | Shirouzu | ............ | H01H 33/596 361/13 |
| 4,823,249 A * | 4/1989 | Garcia, II | ............ | H02M 1/44 363/126 |
| 7,317,305 B1 * | 1/2008 | Stratakos | ............ | H02M 3/157 323/282 |
| 9,013,856 B2 * | 4/2015 | Mahajan | ............ | F02P 3/0892 361/256 |
| 2015/0303806 A1 * | 10/2015 | Madsen | ............ | H02M 7/5383 323/271 |
| 2016/0028222 A1 * | 1/2016 | Johansson | ............ | H01H 9/541 361/91.1 |
| 2017/0126028 A1 * | 5/2017 | Kang | ............ | H02J 7/0014 |

FOREIGN PATENT DOCUMENTS

| EP | 1014397 A1 * | 6/2000 | ............ | H01F 38/08 |
|---|---|---|---|---|
| EP | 1014397 A1 * | 6/2000 | ............ | H01F 38/08 |

OTHER PUBLICATIONS (IEEEXplore[online]. ieeexplore.ieee.org [retrieved on Jun. 6, 2012]. Retrieved from the Internet: <URL: http://ieeexplore.ieee.org/stamp/stamp.jsp?arnumber=6095375>.*

(Continued)

*Primary Examiner* — Scott Bauer
*Assistant Examiner* — Nicolas Bellido
(74) *Attorney, Agent, or Firm* — Venable LLP; Henry J. Daley; Ryan T. Ward

(57) ABSTRACT

An improved DC circuit breaker is provided for automatically detecting and isolating a fault between a source and a ground. The DC circuit breaker comprises at least one switch, in electrical series with a first inductor between the source and a load, and a second inductor magnetically coupled to the first inductor wherein a first side of the second inductor is electrically connected to the load and a second side of the second inductor is grounded through a capacitor.

9 Claims, 10 Drawing Sheets

(56) References Cited

OTHER PUBLICATIONS (IEEEXplore[online]. ieeexplore.ieee.org [retrieved on Jun. 4, 2013]. Retrieved from the Internet: <URL: http://ieeexplore.ieee.org/stamp/stamp.jsp?arnumber=6523783>.*
(IEEEXplore[online]. ieeexplore.ieee.org [retrieved on Jun. 6, 2012]. Retrieved from the Internet: <URL: http://ieeexplore.ieee.org/stamp/stamp.jsp?arnumber=6095375>. (Year: 2012).*
(IEEEXplore[online]. ieeexplore.ieee.org [retrieved on Jun. 4, 2013]. Retrieved from the Internet: <URL: http://ieeexplore.ieee.org/stamp/stamp.jsp?arnumber=6523783>. (Year: 2013).*
Bolanowski et al., "A Fast DC Hybrid Circuit Breaker," IEEE Colloquium on Electronic-Aided Current-Limiting Circuit Breaker Developments and Applications, Nov. 1989.
Candelaria et al., "VSC-HVDC System Protection: A Review of Current Methods," *IEEE Power and Energy Society Power Systems Conference*, Mar. 2011.
Chang et al., "Analysis and Design of DC System Protection Using Z-Source Circuit Breaker," *IEEE Transactions on Power Electronics*, vol. 31, No. 2, pp. 1036-1049, Feb. 2016.
Chang et al., "Design of DC System Protection," *IEEE Electric Ship Technologies Symposium*, pp. 500-508, Apr. 2013.
Corzine et al., "A New Z-Source Dc Circuit Breaker," *IEEE International Symposium on Industrial Electronics*, pp. 585-590, Bari Italy, Jul. 2010.
Corzine et al., "A New Z-Source DC Circuit Breaker," *IEEE Transactions on Power Electronics*, vol. 27, No. 6, pp. 2796-2804, Jun. 2012.
Corzine et al., "Structure and Analysis of the Z-Source MVDC Breaker," IEEE Electric Ship Technologies Symposium, pp. 334-338, Alexandria VA, Apr. 2011.
Corzine, K. A., "Circuit Breaker for DC Micro Grids," IEEE International Conference on DC Microgrids, pp. 221-221c, Jun. 2015.
Corzine, K. A., "DC Micro Grid Protection with the Z-Source Breaker," IEEE Industrial Electronics Conference, Vienna Austria, Nov. 2013.
Cuzner et al., "Circuit Breaker Protection Considerations in Power Converter-fed DC Systems," IEEE Electric Ship Technologies Symposium, pp. 360-367, Apr. 2009.
Cuzner et al., "The Status of DC Micro-Grid Protection," IEEE Industrial Applications Society Annual Meeting, Oct. 2008.
Gowaid et al, "Quasi Two-Level Operation of Modular Multilevel Converter for use in a High-Power DC Transformer with DC Fault Isolation Capability," IEEE Transactions on Power Electronics, vol. 30, No. 1, pp. 108-123, Jan. 2015.
Liu et al., "Topological Analysis of HVDC Circuit Breaker with Coupling Transformer," IEEE International Conference on DC Microgrids, pp. 129-134, Jun. 2015.
Magnusson et al., "Separation of the Energy Absorption and Overvoltage Protection in Solid-State Breakers by the Use of Parallel Varistors," IEEE Transactions on Power Electronics, vol. 29, No. 6, pp. 2715-2722, Jun. 2014.
Magnusson et al., "The Commutation Booster, a New Concept to Aid Commutation in Hybrid DC-Breakers," Cigré Symposium on HVDC, Lund, Sweden, May 2015.
Maqsood et al., "The Z-Source Breaker for Ship Power System Protection," IEEE Electric Ship Technologies Symposium, Alexandria VA, Jun. 2015.
Maqsood et al., "Z-Source Breakers with Coupled Inductors," IEEE Energy Conversion Congress and Exposition, Montreal Canada, Sep. 2015.
McEwan et al., "A Two-Stage DC Thyristor Circuit Breaker," IEEE Transactions on Power Electronics, vol. 12, No. 4, pp. 597-607, Jul. 1997.
Meyer et al., "Circuit Breaker Concepts for Future High-Power DC-Applications," IEEE Industry Applications Society Conference, vol. 2, pp. 860-866, 2005.
Meyer et al., "Solid-State Circuit Breaker Based on Active Thyristor Topologies," IEEE Transactions on Power Electronics, vol. 21, No. 2, pp. 450-458, Mar. 2006.
Miao et al., "A Self-Powered Ultra-Fast DC Solid State Circuit Breaker using a Normally-On SiC JFET," IEEE Applied Power Electronics Conference and Exposition, pp. 767-773, Mar. 2015.
Nuutinen et al., "Short-Circuit Protection in a Converter-Fed Low-Voltage Distribution Network," IEEE Transactions on Power Electronics, vol. 28, No. 4, pp. 1587-1597, Apr. 2013.
Overstreet et al., "Modified Z-Source DC Circuit Breaker Topologies," IEEE Clemson Power Systems Conference, Clemson SC, Mar. 2014.
Park et al., "Fault Detection and Isolation in Low-Voltage DC-Bus Microgrid System," IEEE Transactions on Power Delivery, vol. 28, No. 2, pp. 779-787, Apr. 2013.
Pokryvailo et al., "A Hybrid Repetitive Opening Switch for Inductive Storage Systems and Protection of DC Circuits," IEEE Power Modulator Symposium, High-Voltage Workshop, pp. 612-615, 2002.
Prempraneerach et al., "Optimization of a Z-Source DC Circuit Breaker," IEEE Electric Ship Technologies Symposium, pp. 480-486, Apr. 2013.
Salomonsson et al., "Protection of Low-Voltage DC Microgrids," IEEE Transactions on Power Delivery, vol. 24, No. 3, pp. 1045-1053, Jul. 2009.
Sano et al., "A Surgeless Solid-State DC Circuit Breaker for Voltage-Source-Converter-Based HVDC Systems," IEEE Transactions on Industry Applications, vol. 50, No. 4, pp. 2690-2699, Jul./Aug. 2014.
Schmerda et al., "Shipboard Solid-State Protection: Overview and Applications," IEEE Electrification Magazine, vol. 1, Iss. 1, pp. 32-39, Sep. 2013.
Shukla et al., "A Survey on Hybrid Circuit-Breaker Topologies," IEEE Transactions on Power Delivery, vol. 30, No. 2, pp. 627-641, Apr. 2015.

* cited by examiner

PRIOR ART

CIRCUIT BREAKER FOR DC CIRCUITS USING COUPLED INDUCTION

CROSS-REFERENCE TO RELATED APPLICATIONS

The present application claims priority to U.S. Provisional Patent Appl. No. 62/101,423 filed Jan. 9, 2015, which is incorporated herein by reference.

BACKGROUND

The present invention is directed to a new type of solid-state breaker that uses magnetic coupling instead of a crossed connection to accomplish an automatic response to an electrical fault.

Since the great debate between Thomas Edison and Nikola Tesla our nations power system has operated on alternating current (AC). This was chosen over direct current (DC) because of the need to step up the voltage to a high value using transformers for long-distance power transmission. Traditional transformers available at the time only operated on AC. Nowadays, many energy sources such as solar panels, fuel cells, batteries, etc. supply a DC voltage. Also, DC/DC power converters are common-place for transforming the voltage and interfacing these DC sources to a larger system. Because of this, local DC power systems, or micro grids, have become increasingly more popular. Furthermore, interfacing a wind power generator to a DC system is much simpler than interfacing to an AC system since an AC/DC conversion is needed for the former and an AC/DC/AC conversion is needed for the latter. Although the energy sources and power conversion is readily available for DC power systems, circuit breakers are not. Breaking an AC circuit is much easier than breaking a DC circuit. The DC circuit has a constant current without a zero crossing, and thus breaking this circuit causes arcing that cannot be extinguished. Options for making a DC circuit breaker include a hybrid mechanical/electrical design, a solid state breaker, and z-source breakers as described herein.

C. Meyer, M. Kowal, and R. W. De Doncker, "Circuit Breaker Concepts for Future High-Power DC-Applications," *IEEE Industry Applications Society Conference*, volume 2, pages 860-866, 2005 describes a hybrid mechanical/electrical breaker. A mechanical switch is placed in parallel with solid-state devices. During normal operation, the mechanical switch conducts the main current. A fault detection circuit opens the mechanical switch and diverts the current through a power transistor, then to a metal-oxide varistor. This device clamps the breaker voltage until the fault current can be reduced by the system inductance. The primary advantage of the hybrid breaker is low power losses during normal operation. A disadvantage of this circuit is the time needed for fault detection and switch turn-off leading to the source therefore a significant amount of current can be experienced before the fault can be isolated.

A. Pokryvailo and I. Ziv, "A Hybrid Repetitive Opening Switch For Inductive Storage Systems And Protection Of Dc Circuits," *IEEE Power Modulator Symposium, High-Voltage Workshop*, pages 612-615, 2002 demonstrates a solid-state breaker. A silicon-controlled rectifier (SCR) conducts the current. A resonant L-C circuit is also part of the breaker and has the capacitor pre-charged. Upon detection of a fault, a secondary switch places the L-C circuit in parallel with the SCR. This causes a resonance whereby the SCR current goes to zero and the SCR switches off; isolating the faulty load. After opening, a third inductive branch is connected to the L-C circuit causing a reversal of polarity in the capacitor so that the breaker is reset and ready for operation again. The solid-state breaker offers fast switching times which is important in DC power systems so that the source current does not build up to excessive levels. The primary disadvantage of this circuit is the on-state power losses.

R. Schmerda, R. Cuzner, R. Clark, D. Nowak, and S. Bunzel, "Shipboard Solid-State Protection: Overview and Applications," *IEEE Electrification Magazine*, volume 1, issue 1, pages 32-39, 2013 presents a special type of solid-state circuit breaker. After fault detection, a main path transistor disconnects the faulty load. This circuit has an additional diode path which picks up the load current after the source is disconnected. The concept has been extensively developed and tested for Naval shipboard power systems. This circuit has an advantage of being extremely fast. Normal on-state power losses are an issue as is the need for fault detection.

K. A. Corzine and R. W. Ashton, "A New Z-Source Dc Circuit Breaker," *IEEE Transactions on Power Electronics*, volume 27, number 6, pages 2796-2804, June 2012 introduced a new concept in the solid-state breaker circuits called the z-source breaker. An added crossed connection of inductors and capacitors causes the breaker to automatically switch off in response to a transient change in the load current. This circuit has the advantage of quick fault isolation that is typical of solid-state breakers. This circuit has the additional advantage that detection of the fault is not necessary. Furthermore, the source does not experience a fault current and instead, the source current is pushed to zero during a fault. The primary disadvantage of this circuit is the on-state power losses.

A. H. Chang, A. Avestruz, S. B. Leeb, and J. L. Kirtley, "Design of DC System Protection," *IEEE Electric Ship Technologies Symposium*, pages 500-508, April 2013. Shortly after the introduction of the z-source breaker, this group of MIT researchers presented a variation. The primary advantage of this circuit is that it has a common-ground connection between the source and load and has the desirable frequency response property of a low-pass filter.

FIG. 1A shows a typical arrangement of a circuit breaker inserted between a source and load. In this circuit, the source current is monitored for fault current detection. Alternatively, a capacitor can be connected to ground within the breaker as shown in FIG. 1B. This method is good for detecting transient currents and is used in motor drives for detection of shoot-through. That is, a small capacitor in series with some type of current sensor can be connected to the DC bus of a drive. Shoot-through faults create an impulse of current in this capacitor and the detection can immediately switch off the drive's gate signals. Likewise, a short path could be added to any type of DC circuit breaker for fast detection of faults. Instead of monitoring the main path current (between source and load) and allowing the source to experience the fault current for a while, the short path between the added capacitor and load readily indicates the fault.

In spite of the ongoing effort those of skill in the art still do not have a suitable option for a circuit breaker suitable for DC applications. An improved DC circuit breaker is provided herein.

SUMMARY OF THE INVENTION

It is an object of the invention to provide a circuit breaker for DC applications.

It is an object of the invention to circuit breaker for DC applications which minimizes parasitic power loss in use and can rapidly and automatically isolate a fault.

These and other advantages, as will be realized, are provided in a DC circuit breaker for automatically detecting and isolating a fault between a source and a ground. The DC circuit breaker comprises at least one switch, in electrical series with a first inductor between the source and a load, and a second inductor magnetically coupled to the first inductor wherein a first side of the second inductor is electrically connected to the load and a second side of the second inductor is grounded through a capacitor.

Yet another embodiment is provided in a DC circuit breaker for automatically detecting and isolating a fault between a source and a ground. The DC circuit breaker comprises at least one switch in electrical series between the source and a first side of a first inductor; and a second inductor magnetically coupled to the first inductor wherein a first side of said second inductor is grounded through a capacitor and the first side of the second inductor is in electrical series with the first inductor and a second side of the second inductor is in electrical contact with load.

FIGURES

FIGS. 1A and 1B schematically illustrate fault sensing techniques using a path from the source or from the breaker.

Figure 5:
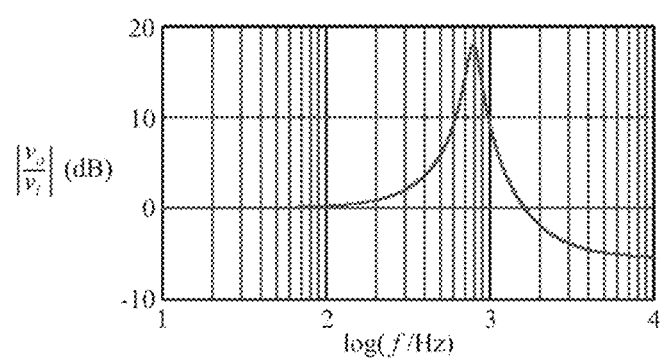

FIG. 5 graphically illustrates the voltage transfer function of a DC breaker.

Figure 6:
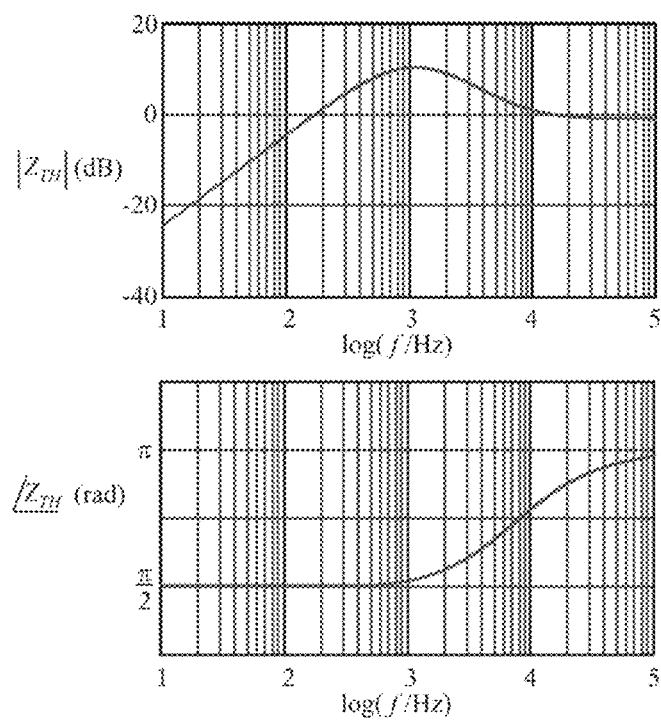

FIG. 6 graphically illustrates Thevenin impedance of a DC breaker.

Figure 7:
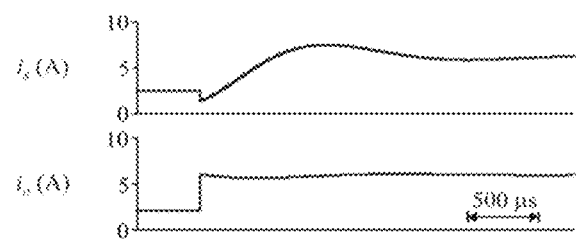

FIG. 7 graphically illustrates an embodiment of the invention.

Figure 8:
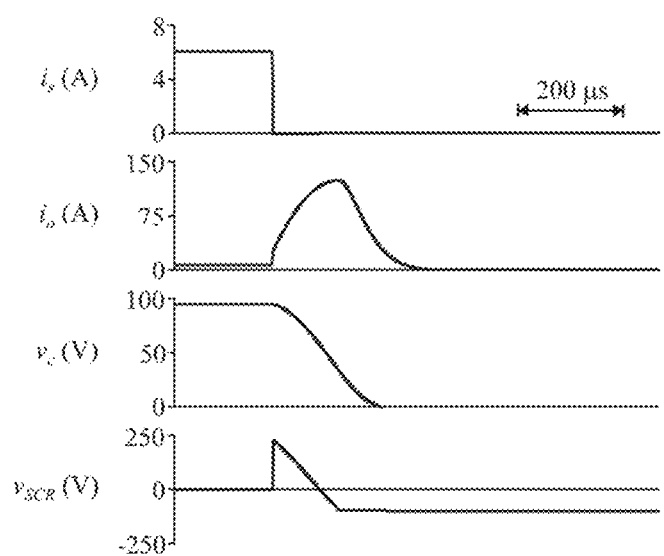

FIG. 8 graphically illustrates an embodiment of the invention.

Figure 9:
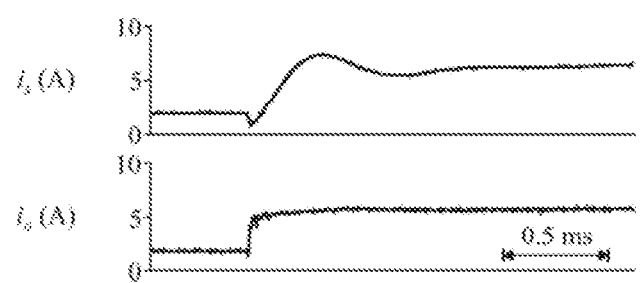

FIG. 9 graphically illustrates a measured response to a step change in load.

Figure 10:
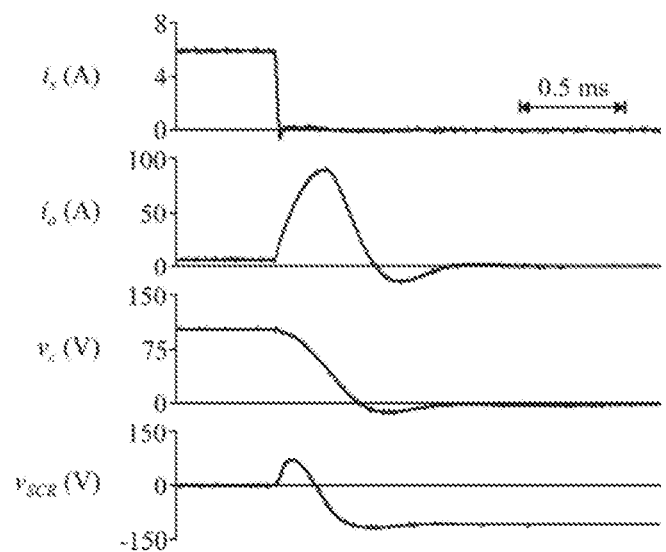

FIG. 10 graphically illustrates a measured response to a fault.

Figure 11:
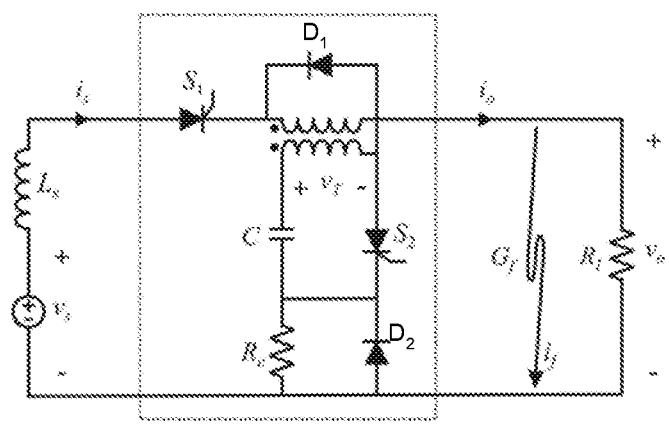

FIG. 11 is a schematic representation of a DC circuit breaker.

Figure 12:
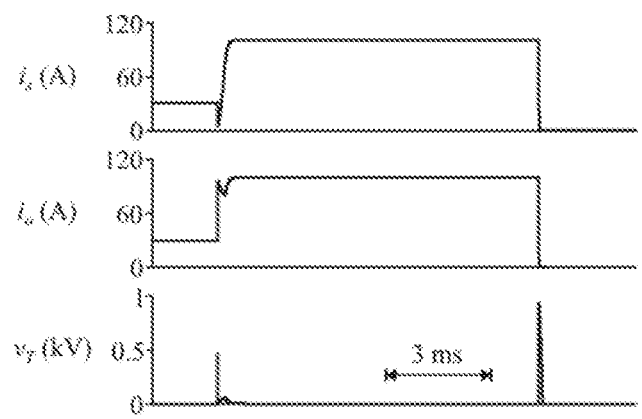

FIG. 12 graphically illustrates a simulation demonstration of switch-off capability.

Figure 13:
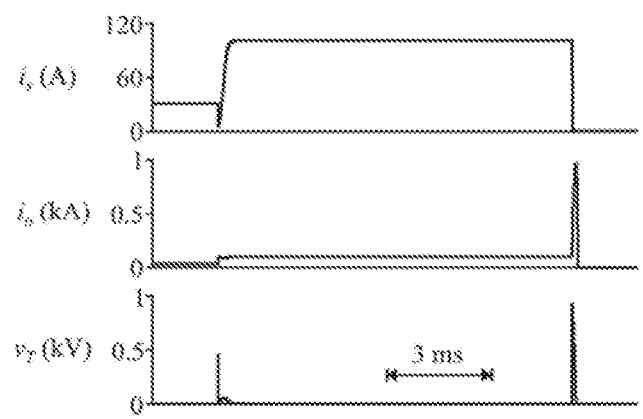

FIG. 13 graphically illustrates a simulation demonstration of fault handling.

DESCRIPTION

The instant invention is specific to solid-state DC circuit breakers that use magnetic coupling instead of a crossed connection to accomplish an automatic response to an electrical fault. The present invention provides a number of advantages. The common ground is connected from source to load and the source current goes to zero in response to an electrical fault without ringing. The inventive circuit has fewer parts than a z-source breaker and other solid-state breakers. This makes for easier manufacturing and higher reliability. The turns ratio of the magnetically coupled circuit can be used to set a threshold level for the fault current therefore the circuit breaker will not respond to large changes in load but will still isolate faults.

The invention will be described with reference to the various figures which form an integral non-limiting component of the disclosure. Throughout the disclosure similar elements will be numbered accordingly.

An embodiment of the invention will be described with reference to FIG. 2 wherein an inventive DC circuit breaker is illustrated schematically. During normal steady-state operation, current flows from the source to the load through the SCR and coupled inductors. A fault on the load side will cause an impulse current $i_c$ in the short path containing the capacitor and secondary winding of the coupled inductors. Based on the turns ratio, this current is reflected to the primary and essentially pushes the SCR current to zero; at which time the SCR switches off. It should be noted that the turns ratio $N_1/N_2$ can also be set so that the DC circuit breaker does not identify a large change in load as a fault.

Figure 1A:
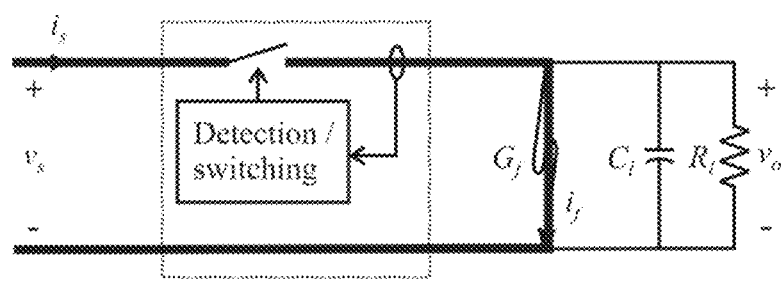
Figure 1B:
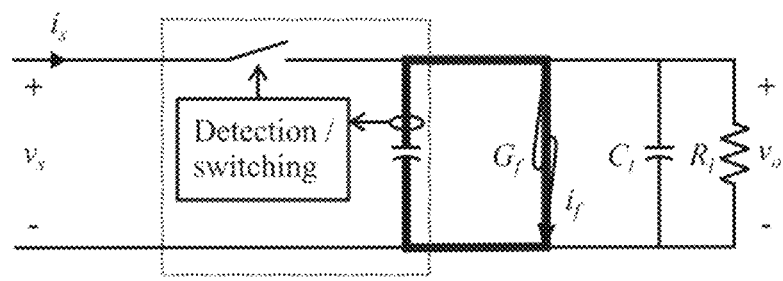
Figure 2:
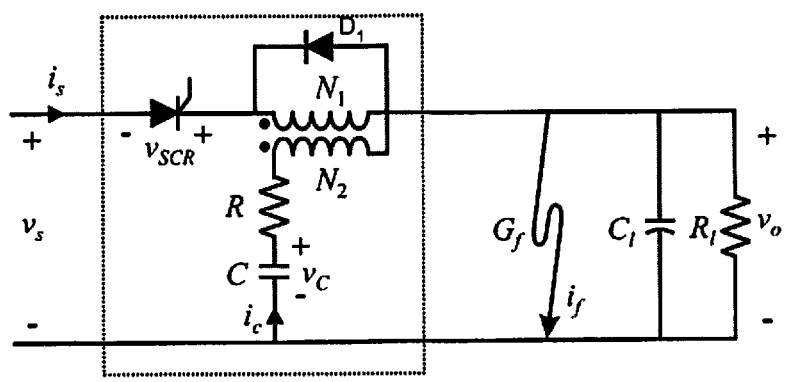
FIG. 2 is a schematic representation of a DC circuit breaker.
Figure 3:
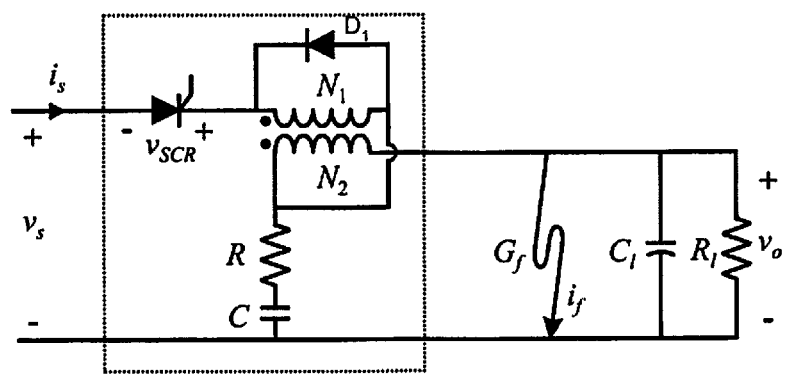
FIG. 3 is a schematic representation of a DC circuit breaker.

An embodiment of the invention is illustrated in schematic view in FIG. 3. In this circuit, the main path current flows through the primary and secondary windings. As with the circuit of FIG. 2, the fault current flows through the secondary winding and causes the SCR current to go to zero.

In FIGS. 2 and 3 the top inductor is referred to as the first inductor and the bottom inductor is referred to as the second inductor for the purposes of clarity in describing the figures. First and second sides are defined for convenience. An optional rectifier is in electrical parallel with the first inductor to minimize ringing. The resistor in the short path, between the appropriate inductor and capacitor to ground can represent a passive or active electronic component such as, but not limited to resistors, inductors, capacitors, varistors, diodes, semi-conductor switches, memresistors and the like. The SCR represents a switch selected from a silicon-controlled rectifier, an insulated-gate bipolar transistor (IGBT) a metal-oxide-semiconductor field-effect transistor and a mechanical switch. More preferably, the SCR represents a switch selected from a silicon-controlled rectifier and an insulated-gate bipolar transistor with a silicon controlled rectifier being most preferred.

One of the main features of the inventive DC switch is its ability to remain on during a step change in load. This is accomplished by the design of the transformer component as further described herein. From FIG. 2, and neglecting transformer magnetizing current, $$i_s = i_0 - \frac{N_2}{N_1} i_c \tag{1}$$

For steady-state operation, the capacitor current is zero and the source current is equal to the output current. Assuming that a sudden change in output current is entirely represented by a change in capacitor current, that is, $$\Delta i_c \approx \Delta i_o \tag{2}$$

by transformer action, $$i_s \approx -\frac{N_2}{N_1} i_c \approx -\frac{N_2}{N_1} i_o \tag{3}$$

and with an initial output current of $$i_s = I_o \tag{4}$$

the response of the source current to a change in output current will be $$i_s = I_o - \frac{N_2}{N_1}\Delta i_o. \qquad (5)$$

The source current, and thus the SCR current, will go to zero when the change in output meets the condition $$\Delta i_o > \frac{N_2}{N_1} I_o \qquad (6)$$

therefore, equation (6) can be used to determine the amount of change in output current that will result in the breaker switching off. This can also be used to select a turns ratio to ensure that the breaker will not switch off during expected load transients.

The breaker design starts with choosing a wire size and carrying out a design for the transformer primary winding. For the purposes of illustration a wire with a diameter of 0.82 mm² is considered. For this non-limiting illustrative design, the transformer is an air-core type wound around a square capacitor having dimensions of 70 mm by 57.5 mm for the purposes of illustration without limit thereto. A number of turns is selected and 5% leakage inductance is assumed for the instant examples without limit thereto. The resulting parameters are displayed in Table I. In this case a turns ratio of 3 is selected so that the transient load current can step by 300% without switching the breaker off. Turn ratios of 1/100 to 100 can be employed to optimize the anticipated transient load. Using the same wire size as the primary, the secondary parameters are computed and shown in Table I. In this design, the SCR total turn-off time $t_q$ is taken into account and the resonance formed by $L_{m2}$ and C is set so that a quarter cycle is three times the turn-off time. This results in the value of capacitance in Table I. The resistance is set to a low value as not to interfere with the breaker performance, but still able to provide damping of the oscillations which occur when the breaker is switched off. The last row of Table I shows the SCR ratings based on a 100V 6 A DC load which is within the ratings of the selected SCR.

TABLE I

Parameters of the test system.

| | | | |
|---|---|---|---|
| $N_1 = 70$ | $r_1 = 0.373\ \Omega$ | $L_{l1} = 51\ \mu H$ | $L_{m1} = 960\ \mu H$  C = 100 μF |
| $N_2 = 24$ | $r_2 = 0.128\ \Omega$ | $L_{l2} = 6\ \mu H$ | $L_{m2} = \mu H$   R = 0.2 Ω |
| $V_{RRM} = 400\ V$ | $I_{TRMS} = 40\ A$ | $t_q = 35\ us$ | |

Figure 4:
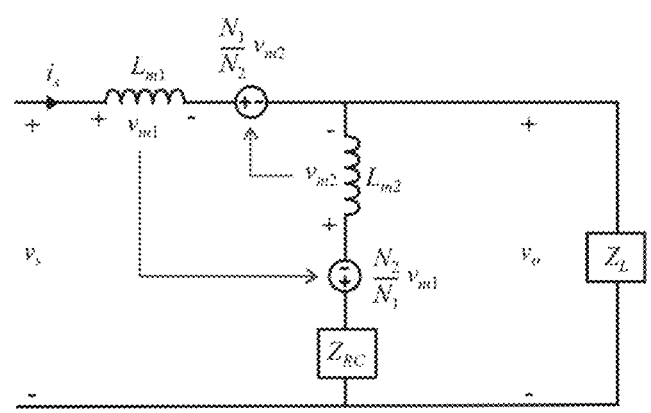
FIG. 4 is a schematic representation of an equivalent circuit of a DC breaker.

FIG. 4 shows the equivalent circuit of the inventive breaker with the SCR conducting. In this circuit, the transformer resistance and leakage inductance are neglected.

In the equivalent circuit illustrated in FIG. 4 $Z_{RC}$ is the series combination of R and C. $Z_L$ is the parallel combination of $R_f$ and $C_f$. Furthermore, $L_{m1}$ and $L_{m2}$ are the primary and secondary magnetizing inductances of the transformer respectively. From the equivalent circuit, it can be determined that the voltage transfer function is $$\frac{v_o}{v_s} = \frac{s(L_{m2} - L_{12}) + Z_{RC}}{s\left(\frac{L_{m1}Z_{RC}}{Z_L} + L_{m1} + L_{m2} - 2L_{12}\right) + Z_{RC}} \qquad (7)$$

and the impedance as seen from the source is $$\frac{v_s}{i_s} = \frac{s\left(\frac{L_{m1}Z_{RC}}{Z_L} + L_{m1} + L_{m2} - 2L_{12}\right) + Z_{RC}}{s\left(\frac{L_{m2}}{Z_L} + \frac{L_{m2}}{Z_{RC}} - \frac{L_{12}^2}{L_{m1}Z_{RC}}\right) + \frac{Z_{RC}}{Z_L} + 1} \qquad (8)$$

where $$L_{12} = \sqrt{L_{m1}L_{m2}} \qquad (9)$$

FIG. 5 shows the voltage transfer function according to (7) for the proposed breaker with parameters in Table I. In this example, $R_f$=50 Ω and $C_f$=0. At low frequencies, the inventive DC circuit breaker has unity gain. There is a resonance around 800 Hz and the breaker attenuates signals of higher frequency. The transfer function is similar to that of a notch filter with attenuation at high frequencies.

It is instructive to look at the proposed circuit in terms of it's Thevenin equivalent. With the device open-circuited, the Thevenin voltage can be seen to be $v_s$. Based on mathematical circuit analysis the Thevenin impedance is defined by:

$$Z_{TH} = \frac{sL_{m1}Z_{RC}}{s(L_{m2} - L_{m1}) + Z_{RC}} \qquad (10)$$

Using the parameters from before, the plot of Thevenin impedance is shown in FIG. 6. At low frequencies, this is seen as inductive and has the value $L_{m1}$. This is seen from equation (10) and $Z_{RC}$ is an open-circuit at low frequencies. At high frequencies, the Thevenin impedance becomes a negative resistor. Thus, considering the Thevenin equivalent, applying a transient or high-frequency fault results in current flow back to the source which causes the source (or SCR) current to go to zero. The DC circuit breaker presented herein automatically responds to faults. A comparison of various prior art DC breaker topologies is shown in Table II. The "+" symbol in a column indicates where that circuit has an advantage, the "−" indicates a disadvantage, and the "0" represents a neutral comparison.

TABLE II

Comparison of the proposed breaker to z-source variants

| | Classic | Series | Modified series | New series | Proposed |
|---|---|---|---|---|---|
| Common source/load ground | − | + | + | + | + |
| Low-pass filter transfer function | − | − | + | + | 0 |
| Invariant to load steps | − | − | − | + | + |
| No ringing in source current | + | − | − | − | + |

As can be seen, the classic z-source breakers have a number of limitations. A common ground between the source and load is established with the series design but then the source current would ring after the SCR switched off. This is an inconvenience since the source current can ring up to a large value and inductance must be increased to limit this ringing. The modified series design also addresses the common ground and further has the desirable property that its transfer function has a low-pass form. Up to this point, all the designs could mistake a step change in load of more than 100% as a fault. The new series design eliminated this by providing an additional branch for the fault current. However, the source current ringing was still problematic. The inventive DC circuit breaker can be seen to have all of the advantages listed in Table II. Furthermore, the inventive DC circuit breaker has much fewer components.

Based on the parameters of Table I, a detailed simulation was carried out with a 100V source voltage and a purely resistive load. FIG. 7 shows the source and load currents when the load is stepped from 50Ω to 16.7Ω. The variables are the same as those labeled in FIG. 2. As can be seen, the load current steps from 2 A to 6 A. This causes a step in capacitor current which reflects back to the source current causing it to dip, but not quite to zero. In fact, applying the criteria (6) with $I_o$=2 A and the turns ratio given in Table I, states that a change of output current by $\Delta i_o$>5.83 A would cause the DC circuit breaker to switch off. This indicates that the output current can step from 2 A up to 7.83 A without switching the DC circuit breaker off. Therefore, the SCR stays on and the source current goes to 6 A after the transient.

FIG. 8 shows the response of the inventive DC circuit breaker to a fault. In this study, the source voltage is 100V and the load resistance is 16.7Ω. A bolted fault occurs at the output which is represented by a 10 m/\ resistance. As the output current starts to rise, the current reflected in the transformer causes the source current to directly go to zero in microseconds. After the SCR switches off, the load current goes up to over 100 A as the capacitor discharges. The SCR voltage first goes positive and it is thus reverse biased for about 100 µs; allowing the SCR to completely turn off. When the SCR voltage goes negative and is equal in magnitude to the source voltage, the diode switches on stopping the resonance.

An example DC circuit breaker, prepared in accordance with the parameters of Table I, is described as follows. In the circuit, the transformer connections are wound around the capacitor for better volume density. The magnetic field will be unaffected by the capacitor and the effective air-core inductor will not experience saturation during transients. The SCR can be to the right and the resistor at the bottom of the board. The top half of the board contains voltage and current transducers which are used only for obtaining waveforms.

FIG. 9 shows the source and output current in response to a step change in load. The output current can be seen to step from 2 A to 6 A. The transient component of this current is reflected through the transformer causing the source current to dip. However, since the current does not go to zero, the SCR continues to conduct. After a transient within the circuit, the source current matches the load current.

FIG. 10 shows measured waveforms of the inventive DC circuit breaker in response to a fault. The source current is seen to go to zero; at which time the SCR switches off. The output current reflects the fault current which increases to about 100 A until the output voltage drops causing the current to go to zero. The last trace shows the SCR voltage. After going off, the SCR is reverse biased for about 100 microseconds, which is longer than the total turn-off time of the SCR.

FIG. 11 shows an inventive DC circuit breaker inserted into a medium-voltage DC system. The RC impedance is replaced with a pure capacitance. In addition, a charging resistor $R_c$ with an accompanying diode is in series. The purpose of the charging resistor is to initially charge the capacitor. That is, when starting, or re-energizing, the source voltage is established then the SCR, labeled $S_1$, is gated on. This causes a charging of the capacitor through the transformer and charging resistor. The desired charging time can be set using the time constant formed by C and $R_c$. Furthermore, the charging resistor limits the initial capacitor surge current. With the diode in parallel, the charging resistor is bypassed during fault operation and the DC circuit breaker responds as described above.

An embodiment of the DC circuit breaker includes a switch-off SCR, labeled $S_2$. This adds an important feature to the DC circuit breaker in that it allows the circuit to be used as a DC switch. During steady-state operation, with the capacitor charged, gating on $S_2$ discharges the capacitor into the secondary winding causing the DC circuit breaker to switch off. Therefore, the DC circuit breaker can be purposely switched off by gating $S_2$. Then switched on again by gating $S_1$. It is important to note that this added switch has the same effect as crow-baring the output. However, since the switch is not placed at the output, it will not cause a short-circuit.

For the purposes of demonstration, a medium-voltage DC (MVDC) system with a source voltage of $v_S$=1000 V and a power level of 100 kW (R—$_f$=10 fl) wherein the source has an inductance of $L_s$=10 pH was prepared. The design of the DC circuit breaker was carried out by selecting a number of turns, turns ratio, and wire diameter sufficient to support full current resulting in a wire with a cross sectional area is 0.42 $cm^2$. In this case, a leakage inductance of 10% is assumed. The transformer was made as an air core a solenoid structure having a radius of about 10 cm with a mass of 13 kg and a volume of 16 L. Table III shows the transformer parameters.

The breaker capacitance was set to 100 uF and the charging resistance is set to 100Ω providing a capacitor charging current with a peak value of 10 A based on $v_s$=1000 V and $R_C$=100Ω thereby providing a reasonable charging time constant based on C=100 µF and R=100Ω.

For this design, a Vishay ST173S12EJ0-PbF SCR was used which has sufficient voltage and current ratings. The SCR is a fast turn-off type with a total turn off time of $t_q$=25 µs.

TABLE III

Parameters of the MVDC breaker design.

| | | | |
|---|---|---|---|
| $N_1$ = 40 | $r_1$ = 10.3 m | $L_{l1}$ = 69 µH | $L_{m1}$ = 625 µH |
| $N_2$ = 14 | $r_2$ = 3.62 mΩ | $L_{l2}$ = 85 µH | $L_{m2}$ = 77 µH |
| $R_c$ = 100 Ω | C = 100 µF | | |
| $V_{RRM}$ = 1200 V | $I_{TRMS}$ = 275 A | $t_q$ = 25 us | |

FIG. 12 shows simulation results of the proposed DC circuit breaker demonstrating switch-off capability. Initially, the DC circuit breaker is supporting a 30 kW load when the load is switched to 100 kW. As can be seen, the source and output current step to rated load and the DC circuit breaker does not switch off. This could be predicted using the turns ratio and equation (6). The voltage across the transformer $v_T$ spikes to 500V. A measurement of this voltage could be used to differentiate between a step change in load and a fault. At the end of the simulation, a gate signal is given to $S_2$. This causes the capacitor to discharge into the transformer secondary winding and, as expected, causes the inventive DC circuit breaker to switch off. Thus, this added SCR can be used to purposely switch off the load.

FIG. 13 shows results of a simulation that is similar to that of FIG. 12 except that the de circuit breaker switches off in response to a fault. As before, the dc circuit breaker does not respond to the step change in load. When the fault is applied, the output current surges, causing the dc circuit breaker to switch off and the source current simply goes to zero. The transformer voltage $V_T$ spikes to about 1 kV when the fault is applied. Thus, the voltage $V_T$ may be of some use in indicating faults. As a control signal, a measure of $V_T$ may be useful in removing the signal to $S_1$, for autonomous operation. It may also prove to be useful in identifying faults that don't have rapid inception. The voltage across one inductor selected from said first inductor and said second inductor of the transformer is utilized as a control signal for fault detection.

As DC sources and DC micro grids become more prevalent, a solution is sought for DC switches and circuit breakers. Traditional methods relied on over-sized AC breakers, hybrid breakers, and solid-state breakers. The inventive DC circuit breaker described herein is a variation on the solid-state breaker, but has the added feature that it can automatically switch off in response to faults. Furthermore, the turns ratio in the circuit's transformer allows the designer to determine the amount of transient current that will be identified as a fault; as opposed to a step change in load. Analysis, design, and laboratory measurements demonstrate the inventive DC circuit breaker's response to a step change in load and to a fault. The DC circuit breaker compares favorably to recent designs in that it has a common ground between source and load, is invariant to step changes in load, and does not produce ringing resonance in the source current.

The invention has been described with reference to the preferred embodiments without limit thereto. One of skill in the art would realize additional embodiments and improvements which are not specifically set forth herein but which are within the scope of the invention as more specifically set forth in the claims appended hereto.

The following references are referred to herein and incorporated by reference:
[1] R. Cuzner, D. MacFarlin, D. Clinger, M. Rumney and G. Castles, "Circuit Breaker Protection Considerations in Power Converter fed Dc Systems," *IEEE Electric Ship Technologies Symposium*, pages 360-367, April 2009.
[2] B. Bolanowski and F. Wojcik, "A Fast Dc Hybrid Circuit Breaker," IEEE Colloquium on Electronic-Aided Current-Limiting Circuit Breaker Developments and Applications, November 1989.
[3] A. Pokryvailo and I. Ziv, "A Hybrid Repetitive Opening Switch for Inductive Storage Systems and Protection ff Dc Circuits," *IEEE Power Modulator Symposium, High-Voltage Workshop*, pages 612-615, 2002.
[4] C. Meyer, M. Kowal, and R. W. De Doncker, "Circuit Breaker Concepts for Future High-Power DC-Applications," *IEEE Industry Applications Society Conference*, volume 2, pages 860-866, 2005.
[5] A. Shukla, and G. D. Demetriades, "A Survey on Hybrid Circuit-Breaker Topologies," *IEEE Transactions on Power Delivery*, volume 30, number 2, pages 627-641, April 2015.
[6] D. Salomonsson, L. Soder, and A. Sannino, "Protection of Low-Voltage Dc Microgrids," *IEEE Transactions on Power Delivery*, volume 24, number 3, pages 1045-1053, July 2009.
[7] J. Candelaria and J. D. Park, "VSC-HVDC System Protection: A Review of Current Methods," *IEEE Power and Energy Society Power Systems Conference*, March 2011.
[8] P. Nuutinen, P. Peltoniemi, and P. Silventoinen, "Short-Circuit Protection in a Converter-Fed Low-Voltage Distribution Network," *IEEE Transactions on Power Electronics*, volume 28, number 4, pages 1587-1597, April 2013.
[9] I. A. Gowaid, G. P. Adam, A. M. Massoud, S. Ahmed, D. Holliday, and B. W. Williams, "Quasi Two-Level Operation of Modular Multilevel Converter for use in a High-Power DC Transformer with Dc Fault Isolation Capability," *IEEE Transactions on Power Electronics*, volume 30, number 1, pages 108-123, January 2015.
[10] P. M. McEwan and S. B. Tennakoon, "A Two-Stage DC Thyristor Circuit Breaker," *IEEE Transactions on Power Electronics*, volume 12, number 4, pages 597-607, July 1997.
[11] C. Meyer and R. W. De Doncker, "Solid-State Circuit Breaker Based on Active Thyristors Topologies," *IEEE Transactions on Power Electronics*, volume 21, number 2, pages 450-458, March 2006.
[12] R. Cuzner and G. Venkataramanan, "The Status of Dc Micro-Grid Protection," *IEEE Industrial Applications Society Annual Meeting*, October 2008.
[13] J. D. Park and J. Candelaria, "Fault Detection and Isolation in Low-Voltage DC-Bus Microgrid System," *IEEE Transactions on Power Delivery*, volume 28, number 2, pages 779-787, April 2013.
[14] R. Schmerda, R. Cuzner, R. Clark, D. Nowak, and S. Bunzel, "Shipboard Solid-State Protection: Overview and Applications," *IEEE Electrification Magazine*, volume 1, issue 1, pages 32-39, September 2013.
[15] J. Magnusson, R. Saers, L. Liljestrand, and G. Engdahl, "Separation of the Energy Absorption and Overvoltage Protection in Solid-State Breakers by the Use of Parallel Varistors," *IEEE Transactions on Power Electronics*, volume 29, number 6, pages 2715-2722, June 2014.
[16] K. Sano and M. Takasaki, "A Surgeless Solid-State Dc Circuit Breaker for Voltage-Source-Converter-Based HVDC Systems," *IEEE Transactions on Industry Applications*, volume 50, number 4, pages 2690-2699, July/August 2014.
[17] Z. Miao, G. Sabui, A. Chen, Y. Li, Z. J. Shen, J. Wang, Z. Shuai, A. Luo, X. Yin, and M. Jiang, "A Self-Powered Ultra-Fast Dc Solid State Circuit Breaker using a Normally-On SiC JFET," IEEE *Applied Power Electronics Conference and Exposition*, volume, number, pages 767-773, March 2015.
[18] K. A. Corzine and R. W. Ashton, "A New Z-Source Dc Circuit Breaker," *IEEE International Symposium on Industrial Electronics*, pages 585-590, Bari Italy, July 2010.
[19] K. A. Corzine and R. W. Ashton, "Structure and Analysis of the Z-Source MVDC Breaker," *IEEE Electric Ship Technologies Symposium*, pages 334-338, Alexandria Va., April 2011.
[20] A. H. Chang, A. Avestruz, S. B. Leeb, and J. L. Kirtley, "Design of Dc System Protection," *IEEE Electric Ship Technologies Symposium*, pages 500-508, April 2013.
[21] P. Prempraneerach, M. G. Angle, J. L. Kirtley, G. E. Kamiadakis, and C. Chryssostomidis, "Optimization of a Z-Source Dc Circuit Breaker," *IEEE Electric Ship Technologies Symposium*, pages 480-486, April 2013.
[22] K. A. Corzine, "Dc Micro Grid Protection with the Z-Source Breaker," *IEEE Industrial Electronics Conference*, Vienna Austria, November 2013.
[23] A. Overstreet, A. Maqsood, and K. A. Corzine, "Modified Z-Source Dc Circuit Breaker Topologies," *IEEE Clemson Power Systems Conference*, Clemson S.C., March 2014.
[24] A. Maqsood and K. A. Corzine, "The Z-Source Breaker for Ship Power System Protection," *IEEE Electric Ship Technologies Symposium*, Alexandria Va., June 2015.
[25] A. H. Chang, B. R. Sennett, A. Avestruz, S. B. Leeb, and J. L. Kirtley, "Analysis and Design of Dc System Protection Using Z-Source Circuit Breaker," *IEEE Transactions on Power Electronics*, volume 31, number 2, pages 1036-1049, February 2016.

[26] A. Maqsood and K. A. Corzine, "Z-Source Breakers with Coupled Inductors," *IEEE Energy Conversion Congress and Exposition*, Montreal Canada, September 2015.

[27] J. Magnusson, R. Saers, and L. Liljestrand, "The Commutation Booster, a New Concept to Aid Commutation in Hybrid DC-Breakers," *Cigré Symposium on HVDC*, Lund, Sweden, May 2015.

[28] Y. Liu, X. Wei, C. Gao, and J. Cao, "Topological Analysis of HVDC Circuit Breaker with Coupling Transformer," *IEEE International Conference on DC Microgrids*, pages 129-134, June 2015.

[29] K. A. Corzine, "Circuit Breaker for DC Micro Grids," *IEEE International Conference on DC Microgrids*, pages 221-221 c, June 2015.

The invention claimed is:

1. A DC circuit breaker for automatically detecting and isolating a fault between a source and a ground comprising:
   a first inductor electrically connected on a first side to a load;
   at least one switch in electrical series with a second side of said first inductor, such that said at least one switch is located between said source and said load;
   a second inductor magnetically coupled to said first inductors;
   an electrical component electrically connected between a capacitor and a around; and
   a second switch electrically connected between said first side of said second inductor and a junction of said capacitor and said electrical component,
   wherein a first side of said second inductor is electrically connected to said load, and
   wherein a second side of said second inductor is grounded through said capacitor.

2. The DC circuit breaker of claim 1, wherein said switch is selected from a silicon-controlled rectifier, an insulated-gate bipolar transistor, a metal-oxide semiconductor field-effect transistor and a mechanical contact.

3. The DC circuit breaker of claim 2, wherein said switch is a silicon-controlled rectifier.

4. The DC circuit breaker of claim 1, wherein when a fault occurs, resonance is prevented by a diode.

5. The DC circuit breaker of claim 1, wherein said electrical component is selected from a passive component and an active component.

6. The DC circuit breaker of claim 5, wherein said electrical component is selected from the group consisting of a resistor, a capacitor, a diode, a semi-conductor switch, a memresistor, a varistor and an inductor.

7. The DC circuit breaker of claim 1, wherein said second switch is selected from a silicon-controlled rectifier, an insulated-gate bipolar transistor, a metal-oxide semiconductor field-effect transistor and a mechanical contact.

8. The DC circuit breaker of claim 7, wherein said second switch is a silicon-controlled rectifier.

9. The DC circuit breaker of claim 1, wherein voltage across one inductor selected from said first inductor and said second inductor is utilized as a control signal for fault detection.

* * * * *